United States Patent [19]
Zafar

[11] Patent Number: 5,750,419
[45] Date of Patent: May 12, 1998

[54] PROCESS FOR FORMING A SEMICONDUCTOR DEVICE HAVING A FERROELECTRIC CAPACITOR

[75] Inventor: Sufi Zafar, Austin, Tex.

[73] Assignee: Motorola, Inc., Schaumburg, Ill.

[21] Appl. No.: 803,789

[22] Filed: Feb. 24, 1997

[51] Int. Cl.$^6$ .................. H01G 7/06; H01L 21/8239
[52] U.S. Cl. .................. 438/3; 438/240; 438/250; 438/253
[58] Field of Search .................. 437/52, 919, 60, 437/47; 438/3, 238–240, 250–256, 381, 393–398

[56] References Cited

U.S. PATENT DOCUMENTS

| | | | |
|---|---|---|---|
| 4,091,406 | 5/1978 | Lewis | 357/54 |
| 4,091,407 | 5/1978 | Williams et al. | 357/54 |
| 4,097,889 | 6/1978 | Kern et al. | 357/54 |
| 4,446,194 | 5/1984 | Candelaria et al. | 428/428 |
| 4,620,986 | 11/1986 | Yau et al. | 427/93 |
| 4,625,227 | 11/1986 | Hara et al. | 357/68 |
| 4,733,289 | 3/1988 | Tsurumaru | 357/54 |
| 5,046,043 | 9/1991 | Miller et al. | 365/149 |
| 5,327,012 | 7/1994 | Yano et al. | 257/758 |
| 5,401,680 | 3/1995 | Abt et al. | 437/52 |
| 5,439,840 | 8/1995 | Jones, Jr. et al. | 437/52 |
| 5,583,077 | 12/1996 | Wang et al. | 437/240 |
| 5,624,864 | 4/1997 | Arita et al. | 437/52 |

FOREIGN PATENT DOCUMENTS 58-73124  5/1983  Japan .................. H01L 21/316

OTHER PUBLICATIONS

Sze, VLSI technology, pp. 116, 119, 123, 1983.
Stanley Wolf Ph.D, "Silicon Processing for the VLSI Era", vol. 2: Process Integration. Lattice Press 1990, Semiconductor Memory Process Integration., pp. 635–638.

*Primary Examiner*—Jey Tsai
*Attorney, Agent, or Firm*—George R. Meyer

[57] ABSTRACT

One or more dielectric layers (32, 52) are formed over a ferroelectric capacitor (24) of a FENVM cell, where that the tension within the dielectric layers (32, 52) overlying the ferroelectric capacitor (24) is kept relatively low. By keeping the tension relatively low, the nonvolatile polarization of the FENVM cell is maintained during back end processing steps of a fabrication process.

23 Claims, 3 Drawing Sheets

PROCESS FOR FORMING A SEMICONDUCTOR DEVICE HAVING A FERROELECTRIC CAPACITOR

FIELD OF THE INVENTION

This invention relates in general to processes for forming semiconductor devices, and more particularly, to processes for forming semiconductor devices having ferroelectric capacitors.

BACKGROUND OF THE INVENTION

Ferroelectric nonvolatile memories are gaining acceptance as an alternative to traditional floating gate nonvolatile memories. The ferroelectric nonvolatile memories are capable of retaining data after electrical fields are removed. After formation, the ferroelectric capacitor within a ferroelectric nonvolatile memory (FENVM) cell has a hysterisis curve 12 as illustrated in FIG. 1. Hysterisis curve represents an essentially ideal curve. However, after forming several layers including passivation, the nonvolatile polarization ($P_{NV}$), which is the distance between the two hysterisis curves at a zero applied field, decreases as illustrated in hysterisis curve 14. When $P_{NV}$ becomes too low, correctly reading data within the memory cells becomes difficult and is undesired.

Prior art attempts to reduce the likelihood of decreasing in $P_{NV}$ has focused on the reduction (as opposed to oxidation) of the ferroelectric dielectric layer within the ferroelectric capacitor. Most attempts to lessen the decrease in $P_{NV}$ have been to reduce the amount of hydrogen used during subsequent processing steps, such as deposition and etches, or the increased used of oxygen anneals. While these methods may help reduce the likelihood of decreasing $P_{NV}$, they do not completely solve the problem.

A need exists to form a FENVM having a more stable $P_{NV}$ that is not likely to change during subsequent processing steps. A need also exists for achieving this solution without the use of complicated processing steps or the use of exotic materials.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

One or more dielectric layers are formed over a ferroelectric capacitor of a FENVM cell, where the composite tension within the dielectric layers overlying the ferroelectric capacitor is kept relatively low. By keeping the tension relatively low, the nonvolatile polarization of the FENVM cell is maintained during back end processing steps of a fabrication process. The present invention is better understood with the description of the embodiments below.

Figure 1:
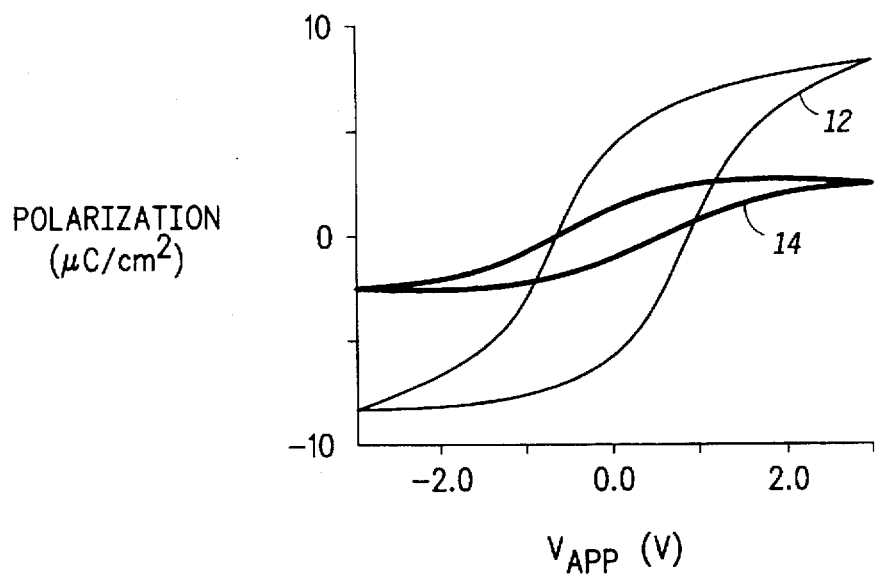
FIG. 1 includes a plot of polarization versus applied voltage for an ideal hysterisis curve and a hysterisis generally seen after forming a substantially completed device (prior art)
Figure 2:
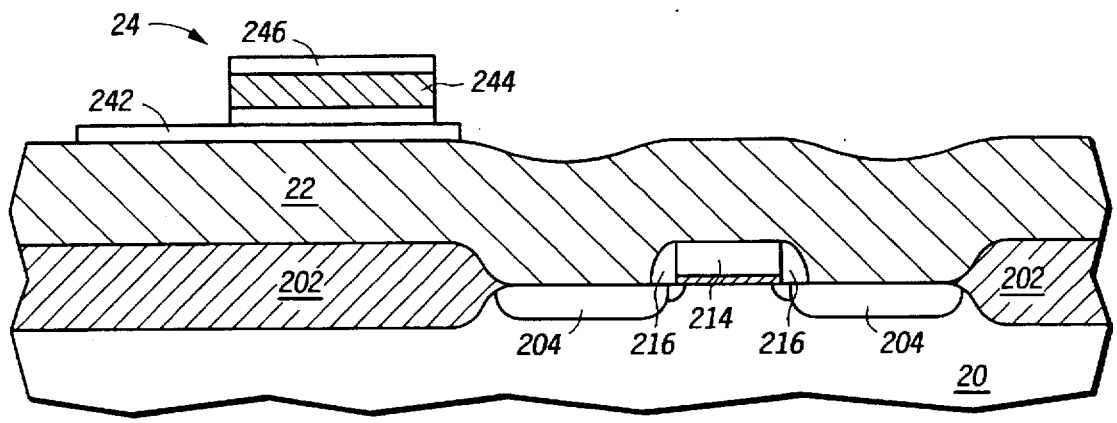
FIG. 2 includes an illustration of a cross-sectional view of a portion of a semiconductor substrate after forming a ferroelectric capacitor.

FIG. 2 includes an illustration of a semiconductor device substrate 20 after forming a ferroelectric capacitor 24. More specifically, the semiconductor device substrate 20 includes field isolation regions 202 and doped regions 204 that are formed within the substrate. As used in this specification, the semiconductor device substrate 20 includes a monocrystalline semiconductor wafer, a semiconductor-on-insulating wafer, or any other substrate used to form semiconductor devices. The field isolation regions 202 are formed using a selective oxidation process or in a trench isolation process. In this particular embodiment, the doped regions 204 are heavily n-type regions that are source/drain regions for the FENVM cell. A gate dielectric layer 212 is formed over the substrate 20 and a gate electrode 214 is formed over the gate dielectric layer 212. In this particular embodiment, the transistor is an n-channel MOS transistor. In other embodiments, a p-channel transistor or a bipolar transistor could be used. Insulating side wall spacers 216 are formed adjacent to the gate electrode 214.

A first interlevel dielectric (ILD) layer 22 is then formed over all the substrate 20 as illustrated in FIG. 2. A ferroelectric capacitor 24 is formed over the first ILD layer 22. The ferroelectric capacitor 24 includes a first electrode 242, a ferroelectric dielectric layer 244, and a second electrode 246. The ferroelectric capacitor 24 is formed using conventional methods.

Figure 3:
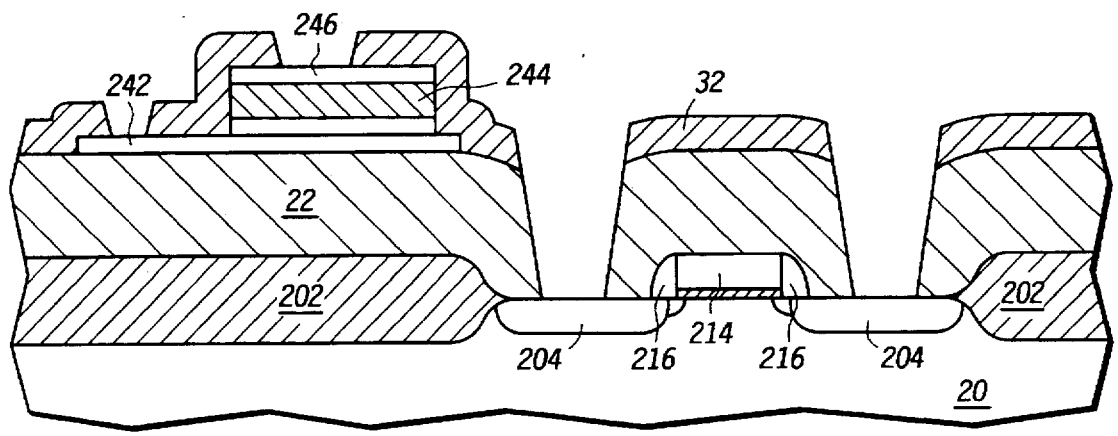
FIG. 3 includes an illustration of the substrate of FIG. 2 after forming a patterned interlevel dielectric layer in accordance with an embodiment of the present invention.

A second ILD layer 32 is then formed over the ferroelectric capacitor 24 as illustrated in FIG. 3. The interlevel dielectric layer is typically formed of plasma tetraethylorthosilicate (plasma TEOS). Contact openings are formed through the second ILD layer 32 to the lower electrode 242, the second electrode 246, and the doped regions 204. The etch sequence is performed using conventional methods.

Figure 4:
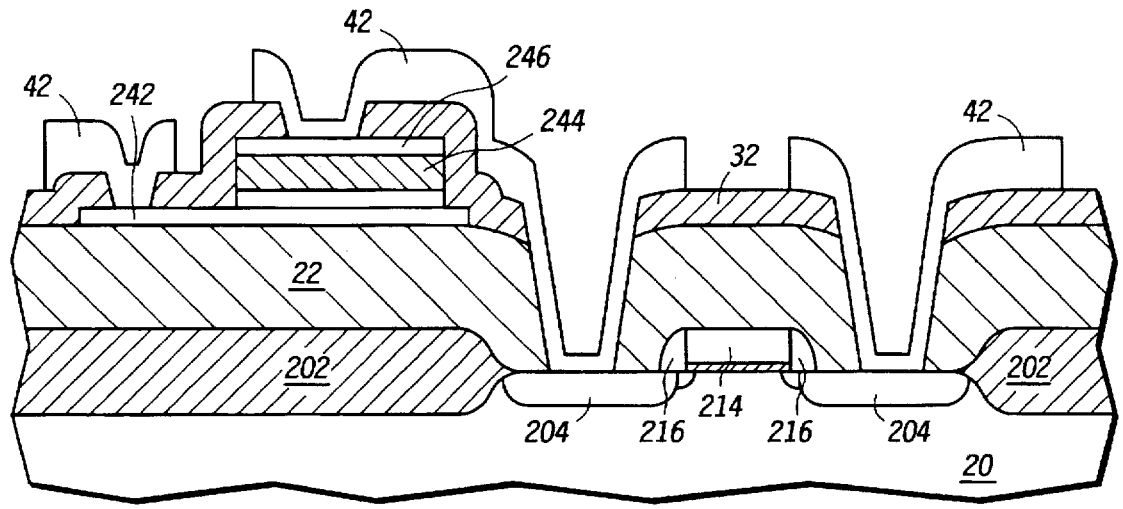
FIG. 4 includes an illustration of a cross-sectional view of the substrate of FIG. 3 after forming interconnects.

Interconnects 42 are formed over the semiconductor device substrate 20 as illustrated in FIG. 4. The interconnects 42 include aluminum, copper, or the like. Referring to FIG. 4, the interconnect near the right-hand side of the FIG. 4 is a bit line contact, the interconnect near the left-hand side of FIG. 4 is a drive line contact, and the middle interconnect is a conductive strap for the storage node and electrically connects one of the doped regions 204 to the second electrode 246 of the ferroelectric capacitor 24.

Figure 5:
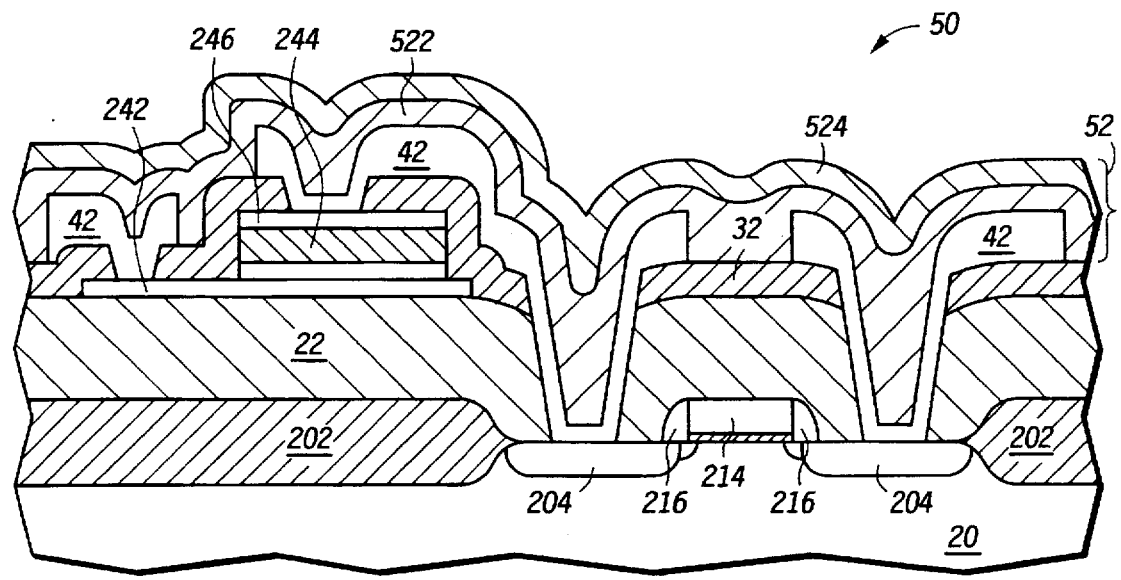
FIG. 5 includes an illustration of a cross-sectional view of the substrate of FIG. 4 after forming a passivation layer in accordance with an embodiment of the present invention.

A passivation layer 52, which is a dielectric layer covering the uppermost interconnect level of a semiconductor device, is formed over the interconnects 42 and the exposed portions of the interlevel dielectric layer 32. The passivation layer includes a lower tensile film 522 and an upper compressive film 524. In one embodiment, the tensile film 522 is phosphosilicate glass (PSG), and the compressive film 524 is silicon oxynitride. At this point, a substantially completed semiconductor device 50 is formed that includes the ferroelectric nonvolatile memory cell. Additional ILD layers and interconnect levels can be formed before the passivation layer 52 but are not shown in FIG. 5

Figure 6:
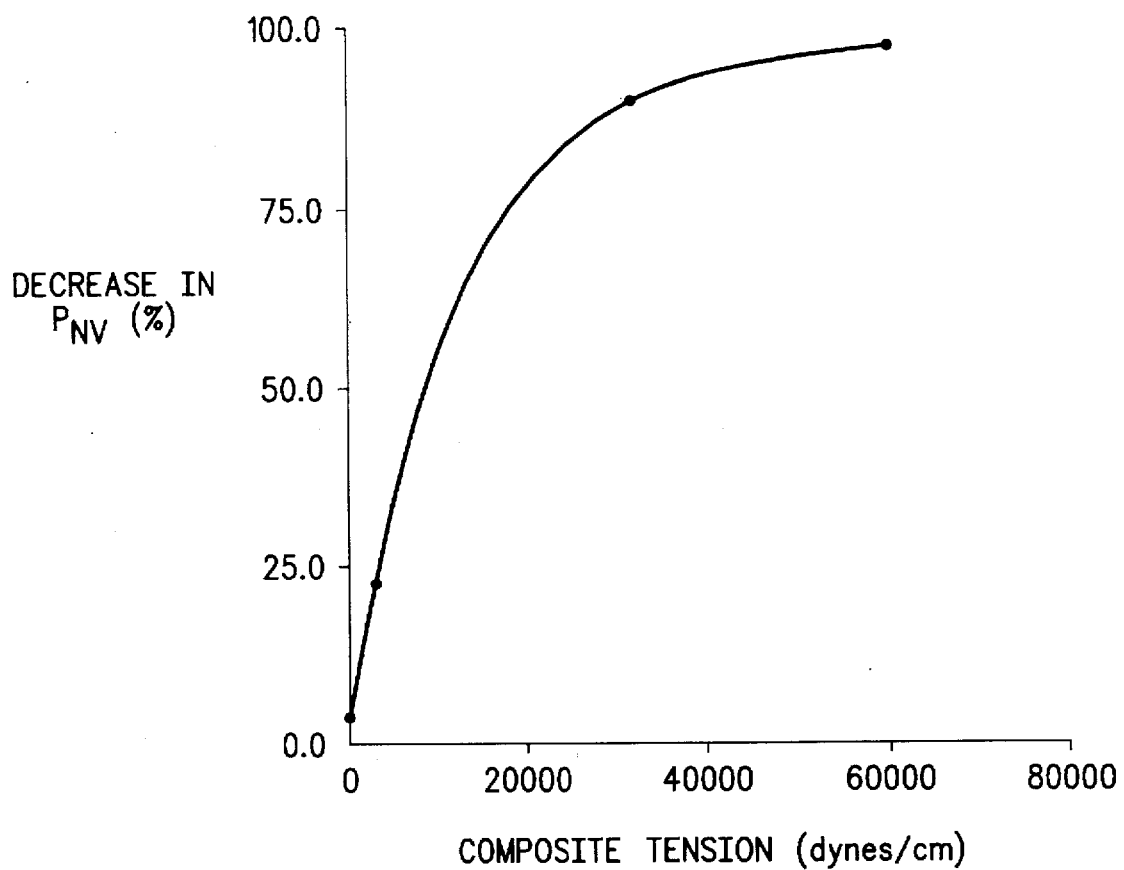
FIG. 6 includes a plot of the decrease of nonvolatile polarization is plotted as a function of composite tension for films within a FENVM cell.

The inventor has discovered that the composite tension within all the dielectric layers, particularly those overlying a planar, horizontally-oriented ferroelectric capacitor, such as ferroelectric capacitor 24, have an impact on the $P_{NV}$ as shown in FIG. 6. As used in this specification, composite tension is the sum of the tensions within the individual dielectric layers including any film(s) within each dielectric layer.

Determining tension and stress of a patterned layer over substrate having various components, such as transistors and capacitors, is nearly impossible to determine. Tension is approximated using unpatterned silicon wafers. Stress, which has units of force per area, is measured at approximately room temperature after depositing a layer or film on the unpatterned silicon wafer. The stress is either tensile or compressive and is typically expressed in units of dynes per square centimeter. Tension, which has units of force per length and is typically expressed in units of dynes per centimeter, for a layer or film is a product of the stress times the thickness of the layer or film itself. Composite tension is the sum of the tensions within the individual layers or films.

As composite tension increases, $P_{NV}$ decreases as a percentage of the initial $P_{NV}$ (as the ferroelectric capacitor 24 is formed). High composite tension causes the hysterisis curve to flatten and look more like the hysterisis curve 14.

The composite tension should be no greater than approximately $2 \times 10^4$ dynes per centimeter (regardless whether the composite tension is tensile or compressive) or cause a decrease in $P_{NV}$ more than 75 percent from the initial $P_{NV}$, which is the $P_{NV}$ of the ferroelectric capacitor after formation but before depositing any layers over the second electrode 246. Further, the tension within each layer should also be kept also below $2 \times 10^4$ dynes per centimeter.

However, within a layer such as passivation layer 52, the tensions within each of the films, such as the tensile film 522 and the compressive film 524, can be higher than the $2 \times 10^4$ dynes per centimeter. However, the composite stress of the tensile film 522 and the compressive film 524 is no greater than $2 \times 10^4$ dynes per centimeter.

Although the prior discussion was directed toward tension, it is possible that relatively high stress films can be used as long as the layer is kept relatively thin. More particularly, the second ILD layer 32 can have a stress that is higher than $10^9$ dynes per square centimeter. In one example, the interlevel dielectric layer could have a stress as high as $10^9$ dynes per square centimeter and yet have a thickness of 1000 angstroms. In this particular embodiment, the tension within the second ILD layer 32 that overlies the ferroelectric capacitor 24 is approximately $10^4$ dynes per centimeter, which is lower than the $2 \times 10^4$ dynes per centimeter limit.

The second ILD layer 32 should have a thickness less than 2000 angstroms to keep the tension below the limit. Typically, passivation layers have thicknesses of at least 6000 angstroms and usually more than 1.0 micron. If the passivation layer 52 has the same stress as the second ILD layer 32, the tension within the passivation layer 52 would exceed the limit. Therefore, high stress layers can be tolerated if their thicknesses are kept thin enough, but thicker layers will more strongly contribute to composite tension.

To the inventor's knowledge, only a single layer of oxide 25 or nitride has been used as a passivation layer for FENVM cells having ferroelectric capacitors. The dual-film passivation layer 52 is tailored to reduce stress on the ferroelectric capacitor 24. Although the tension within each of the tensile and compressive films 522 and 524 may exceed 30 the tension limits, the composite tension within passivation layer 52 is within the composite tension limit because the tension within each film within the passivation layer 52 at least partially cancel out each other.

In general, most of the layers that include a combination of films, such as passivation layer 52, should have the tensile film underlying the compressive film because of a potential for the tensile film to absorb moisture, which can change the tension of the tensile film. Still in other embodiments, a plurality of different films can form a single layer. For example, if copper is used for an interconnect, a diffusion barrier is generally formed over the copper to prevent copper from diffusing into oxide. The diffusion barrier is typically a compressive film. In this particular embodiment, there may be a compressive film covered by a tensile film that is covered by another compressive film. By tailoring the composite tension, $P_{NV}$ for the substantially completed semiconductor device 50 has decreased to no less than 75 percent of the initial $P_{NV}$.

In another embodiment, the ferroelectric capacitor may be formed as a planar, vertically oriented ferroelectric capacitor within a trench. As used herein, vertically oriented means that the capacitor plates are essentially perpendicular to the primary surface of the substrate. In one embodiment, a trench is formed within a substrate. A dielectric layer having a vertical edge is formed within the trench of the substrate. The ferroelectric capacitor is formed near that vertical edge. During temperature cycling, lateral tension within the dielectric layer can compress the electrodes of the ferroelectric capacitor similar to a vise, thereby potentially causing the decreased $P_{NV}$ similar to the embodiment described in FIGS. 2 through 5. To prevent this, the dielectric layer within the trench should be formed such that its tension is no greater than $2 \times 10^4$ dynes per centimeter.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

I claim:

1. A process for forming a semiconductor device comprising the steps of forming a ferroelectric capacitor over a substrate, wherein the ferroelectric capacitor is part of a memory cell; and forming a first dielectric layer after the step of forming a ferroelectric capacitor, wherein the semiconductor device has a characteristic selected from a group consisting of:

the first dielectric layer has a first dielectric layer tension no greater than $2 \times 10^4$ dynes per centimeter; and in a substantially completed semiconductor device, a nonvolatile polarization has decreased to no less than 75 percent of an initial nonvolatile polarization.

2. The process of claim 1, further comprising the step of forming a second dielectric layer after the step of forming a ferroelectric capacitor and before the step of forming the first dielectric layer, wherein the first and second dielectric layers have a composite tension no greater than $2 \times 10^4$ dynes per centimeter.

3. The process of claim 2, further comprising a step of forming an interconnect between the steps of forming the second dielectric layer and forming the first dielectric layer.

4. The process of claim 2, wherein the step of forming the first dielectric layer comprising a step of forming the first dielectric layer that is a passivation layer having a thickness of at least 6000 angstroms.

5. The process of claim 2, wherein the step of forming the first dielectric layer comprises substeps of:
  forming a tensile, dielectric film;
  forming a compressive dielectric film after the step of forming the tensile dielectric film;
  wherein
    the tensile dielectric film has a tensile tension, and the compressive dielectric film has a compressive tension;
    the first dielectric layer tension is a composite tension that is a combination of tensile and compressive tensions; and
    the first dielectric layer tension is no greater than $2 \times 10^4$ dynes per centimeter.

6. The process of claim 1, wherein the step of forming the first dielectric layer comprises substeps of:
  forming a compressive dielectric film;
  forming a tensile dielectric film after the step of forming a compressive dielectric film;
  wherein;
    the tensile dielectric film has a tensile tension, and the compressive dielectric film has a compressive tension;
    the first dielectric layer tension is a composite tension that is a combination of tensile and compressive tensions; and
    the first dielectric layer tension is no greater than $2 \times 10^4$ dynes per centimeter.

7. The process of claim 1, wherein, in the substantially completed semiconductor device, the nonvolatile polarization has decreased to no less than 75 percent of the initial nonvolatile polarization.

8. The process of claim 1, further comprising a step of forming a barrier layer that is compressive.

9. The process of claim 1, wherein the step of forming the first dielectric layer comprises a step of forming a graded dielectric layer that includes a tensile region and a compressive region, wherein the tensile region is formed closer to the substrate compared to the compressive region.

10. The process of claim 1, wherein a portion of the first dielectric layer permanently remains over the ferroelectric capacitor.

11. A process for forming a semiconductor device comprising the steps of:
  forming a first dielectric layer having a vertical edge over a substrate having a primary surface, wherein the first dielectric layer has a first dielectric layer tension no greater than $2 \times 10^4$ dynes per centimeter; and
  forming a vertically oriented ferroelectric capacitor after the step of the forming the first dielectric layer and adjacent to the vertical edge wherein capacitor plates for the vertically oriented ferroelectric capacitor are essentially perpendicular to the primary surface of the substrate,
  wherein the semiconductor device has a characteristic selected from a group consisting of:
    the first dielectric layer has a first dielectric layer tension no greater than $2 \times 10^4$ dynes per centimeter; and
    in a substantially completed semiconductor device, a nonvolatile polarization has decreased to no less than 75 percent of an initial nonvolatile polarization.

12. The process of claim 11, further comprising a step of forming a second dielectric layer after the step of forming the vertically oriented ferroelectric capacitor.

13. The process of claim 12, wherein the step of forming the second dielectric layer further comprises a step of forming the second dielectric layer having a second dielectric layer tension no greater than $2 \times 10^4$ dynes per centimeter.

14. The process of claim 11, wherein the step of forming the first dielectric layer comprises substeps of:
  forming a tensile dielectric film;
  forming a compressive dielectric film after the step of forming a tensile dielectric film,
  wherein;
    the tensile dielectric film has a tensile tension, and the compressive dielectric film has a compressive tension;
    the first dielectric layer tension is a composite tension that is a combination of tensile and compressive tensions; and
    the first dielectric layer tension is no greater than $2 \times 10^4$ dynes per centimeter.

15. The process of claim 11, wherein the step of forming the first dielectric layer comprises substeps of:
  forming a compressive dielectric film;
  forming a tensile dielectric film after the step of forming a compressive dielectric film;
  wherein:
    the tensile dielectric film has a tensile tension, and the compressive dielectric film has a compressive tension;
    the first dielectric layer tension is a composite tension that is a combination of tensile and compressive tensions; and
    the first dielectric layer tension is no greater than $2 \times 10^4$ dynes per centimeter.

16. The process of claim 11, wherein, when the semiconductor device is substantially completed, the nonvolatile polarization has decreased to no less than 75 percent of the initial nonvolatile polarization.

17. The process of claim 11, further comprising a step of forming a barrier layer that is compressive.

18. The process of claim 11, wherein the step of forming the first dielectric layer comprises a step of forming a graded dielectric layer that includes a tensile region and a compressive region, wherein the tensile region is formed closer to the substrate compared to the compressive region.

19. A process for forming a semiconductor device comprising the steps of;
  forming a ferroelectric capacitor over a substrate, wherein the ferroelectric capacitor includes an electrode and is part of a memory cell; and
  forming a plurality of layers overlying the ferroelectric capacitor to finish forming the semiconductor device, wherein: this step includes steps of:
    forming a first dielectric layer on the ferroelectric capacitor
    forming an interconnect over the first dielectric layer and the ferroelectric capacitor, wherein the interconnect is electrically connected to the electrode of the ferroelectric capacitor; and forming a passivation layer over the interconnect and the ferroelectric capacitor, wherein the passivation layer has thickness of at least 6000 angstroms: and the semiconductor device has a characteristic selected from a group consisting of:

a composite tension for the plurality of layers is no greater than $2 \times 10^4$ dynes per centimeter; and in a substantially completed semiconductor device, a nonvolatile polarization has decreased to no less than 75 percent of an initial nonvolatile polarization.

20. The process of claim 19, wherein the substantially completed semiconductor device, the nonvolatile polarization has decreased to no less than 75 percent of the initial nonvolatile polarization.

21. The process of claim 19, wherein:

the step of forming the first dielectric layer includes a step of forming the first dielectric layer having a thickness no greater than 2000 angstroms.

22. The process of claim 21, wherein the step of forming the passivation layer comprises substeps of:

forming a tensile dielectric film;

forming a compressive dielectric film after the step of forming the tensile dielectric film, wherein:

the tensile dielectric film has a tensile tension, and the compressive dielectric film has a compressive tension;

a passivation layer tension is a combination of tensile and compressive tensions; and the passivation layer tension is no greater than $2 \times 10^4$ dynes per centimeter.

23. The process of claim 19, wherein a portion of the first dielectric layer permanently remains over the ferroelectric capacitor.

* * * * *

UNITED STATES PATENT AND TRADEMARK OFFICE
CERTIFICATE OF CORRECTION

PATENT NO.   : 5,750,419
DATED        : May 12, 1998
INVENTOR(S)  : Sufi Zafar

It is certified that error(s) appear in the above-identified patent and that said Letters Patent is hereby corrected as shown below:

Claim 11, column 5, line 62,
        after "edge", insert a comma - - , - -.

Claim 20, column 7, line 11,
        after "wherein", insert - - in - -.

Signed and Sealed this

Tenth Day of November 1998

Attest:

BRUCE LEHMAN

*Attesting Officer*       *Commissioner of Patents and Trademarks*